United States Patent
Confaloneri et al.

(10) Patent No.: US 6,624,672 B2
(45) Date of Patent: Sep. 23, 2003

(54) OUTPUT BUFFER WITH CONSTANT SWITCHING CURRENT

(75) Inventors: Pierangelo Confaloneri, Caponago (IT); Angelo Nagari, Cilavegna (IT); Germano Nicollini, Piacenza (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/032,232

(22) Filed: Dec. 21, 2001

(65) Prior Publication Data

US 2002/0097071 A1 Jul. 25, 2002

(30) Foreign Application Priority Data

Dec. 21, 2000 (EP) .............................................. 00830836

(51) Int. Cl.[7] .................................................. H03B 1/00
(52) U.S. Cl. ....................... 327/112; 327/170; 327/391; 326/83
(58) Field of Search ........................ 327/108–112, 170, 327/379, 389, 391, 206, 205; 326/23, 24, 26, 27, 83, 87

(56) References Cited

U.S. PATENT DOCUMENTS 4,818,901 A * 4/1989 Young et al. .................. 326/27
5,334,885 A * 8/1994 Morris .......................... 326/83
6,008,679 A * 12/1999 Masuda ....................... 327/205

* cited by examiner

Primary Examiner—Terry D. Cunningham
Assistant Examiner—Long Nguyen
(74) Attorney, Agent, or Firm—Lisa K. Jorgenson; Robert Iannucci; Seed IP Law Group PLLC

(57) ABSTRACT

The buffer has an output stage formed by two complementary MOS transistors connected so as to operate in phase opposition between the supply terminals and two driver stages having the input in common. Each driver stage has a first branch comprising a current-generator connected between the gate electrode of the transistor to be driven and a supply terminal and an electronic switch controlled by the input and connected between the same gate electrode and the other supply terminal, and a second branch which comprises, connected in series, a transistor connected as a diode and an electronic switch controlled by the output, and is arranged between the gate electrode of the transistor to be driven and a respective supply terminal. The buffer can control a load with a constant switching current, is simple in structure, and occupies a small area.

13 Claims, 5 Drawing Sheets

OUTPUT BUFFER WITH CONSTANT SWITCHING CURRENT

BACKGROUND OF THE INVENTION

1. Field of the Invention

The present invention relates to integrated circuits and, more particularly, to an output buffer for digital signals.

2. Description of the Related Art

As is known, in an integrated circuit, an output buffer for digital signals is an interface circuit which serves for driving a load which, in most cases, is outside the integrated circuit. Normally, the circuit is dimensioned on the basis of direct-current operating specifications, that is, on the basis of the maximum value of the supply voltage and on the maximum value of the current to be supplied to a predetermined resistive load. As a result of this dimensioning, the switching speed is often much greater than required and this may give rise to serious disadvantages. In particular, as the number of functions which can be integrated in a single chip of semiconductor material increases, the number of outputs of the integrated device increases. The outputs are often grouped in "buses" and have to be switched simultaneously by the respective output buffers. In these cases, very high pulsed currents pass through the impedances and the parasitic resistances associated with the electrical connections between the integrated circuit and the external terminals during switching. These current transients require the external supply to deliver, for very short periods, currents much greater than those required on average for the operation of the device, and therefore necessitate the use of over-dimensioned supply means. This problem is experienced in particular when the integrated device forms part of portable apparatus, that is, of apparatus having limited electrical energy resources. Moreover, the current transients may give rise to spurious internal switching, and hence to losses or alterations of the data associated with the digital signal. In mixed integrated circuits, that is, those containing both digital portions and analog portions, the current transients may prejudice the performance of the analog circuits.

To prevent or at least attenuate the problems explained above, devices must be designed with supply-connection tracks of sufficiently large cross-section. A solution of this type is completely unsatisfactory since it leads to a great wastage of area and does not solve the problem of excessive demands on the supply.

A known output buffer designed to address the problems explained above is shown in FIG. 1. In this example, the buffer is constituted by four pairs of complementary MOS transistors connected so as to operate in phase opposition, in pairs (M1n–M4n; M1p–M4p), but it could be constituted by a much larger number of such pairs. The pairs of transistors are connected between two supply terminals, indicated by the earth symbol and +VDD, and have, as a common terminal, the drain electrodes of the transistors which are connected to an output terminal OUT. The gate electrodes of the first pair M1p, M1n are connected together to the input terminal IN of the buffer and the gate electrodes of the subsequent pairs are connected together to the gate electrodes of the respective preceding pairs by means of delay circuits which, in this example, have equal delay times Δt. The transistors are of a size such that each pair can supply one quarter of the output current to the load, not shown. As a result of the delays, a transition in the level of a signal applied to the input IN gives rise to a much slower transition in the output signal than in the input signal, reducing any current peaks. However, this circuit operates satisfactorily only if it is constituted by a large number of pairs of transistors. This involves the wastage of a large area of the integrated circuit so that this solution is not in practice very much favoured by designers.

Another known buffer is shown schematically in FIG. 2. It is formed by a single pair of complementary MOS transistors Mp and Mn controlled by respective driver stages DRp and DRn. The stages DRp and DRn operate in a manner such as to switch the respective transistors off rapidly and to switch them on slowly by the generation of a constant-current front long enough to cause the output OUT to switch gradually. However, this known buffer is rather complex and, in the same manner as the other known buffer described briefly above, supplies a current which varies in dependence on the load.

BRIEF SUMMARY OF THE INVENTION

Aspects of the present invention involve an output buffer for digital signals in which the switching current, that is, the current delivered or absorbed during the transitions of the digital signal, is independent of the load. Aspects also include an output buffer for digital signals which is simple and reliable and occupies a small area.

Further to these and other aspects, an output buffer for digital signals has an output stage including a first output MOS transistor of a first type and a second MOS transistor of a second type with respective source electrodes connected to a first supply terminal and to a second supply terminal, respectively, drain electrodes connected together to an output terminal (OUT) of the buffer, and gate electrodes connected to an input terminal of the buffer by means of a first driver stage and a second driver stage, respectively.

The first driver stage includes a first circuit branch comprising first current-generator means connected between the gate electrode of the first output transistor and the second supply terminal and a first controlled electronic switch connected between the gate electrode of the first output transistor and the first supply terminal and having a control electrode connected to the input terminal of the buffer. The first driver further includes a second circuit branch comprising a first MOS transistor of the first type connected as a diode in series with a second controlled electronic switch between the gate electrode of the first output transistor and the first supply terminal, the second electronic switch having a control terminal connected to the output terminal of the buffer.

A second driver stage includes a third circuit branch comprising second current-generator means connected between the gate electrode of the second output transistor and the first supply terminal and a third controlled electronic switch connected between the gate electrode of the second output transistor and the second supply terminal (earth) and having a control electrode connected to the input terminal of the buffer. The second driver stage further includes a fourth circuit branch comprising a second MOS transistor of the second type connected as a diode in series with a fourth controlled electronic switch between the gate electrode of the second output transistor and the second supply terminal, the fourth electronic switch having a control terminal connected to the output terminal of the buffer.

Other features and advantages of the invention will become apparent from the following detailed description, taken in conjunction with the accompanying drawings.

BRIEF DESCRIPTION OF THE SEVERAL VIEWS OF THE DRAWINGS

The invention will be understood further from the following detailed description of two embodiments thereof, given by way of non-limiting example, with reference to the appended drawings, in which.

DETAILED DESCRIPTION OF THE INVENTION

Figure 3:
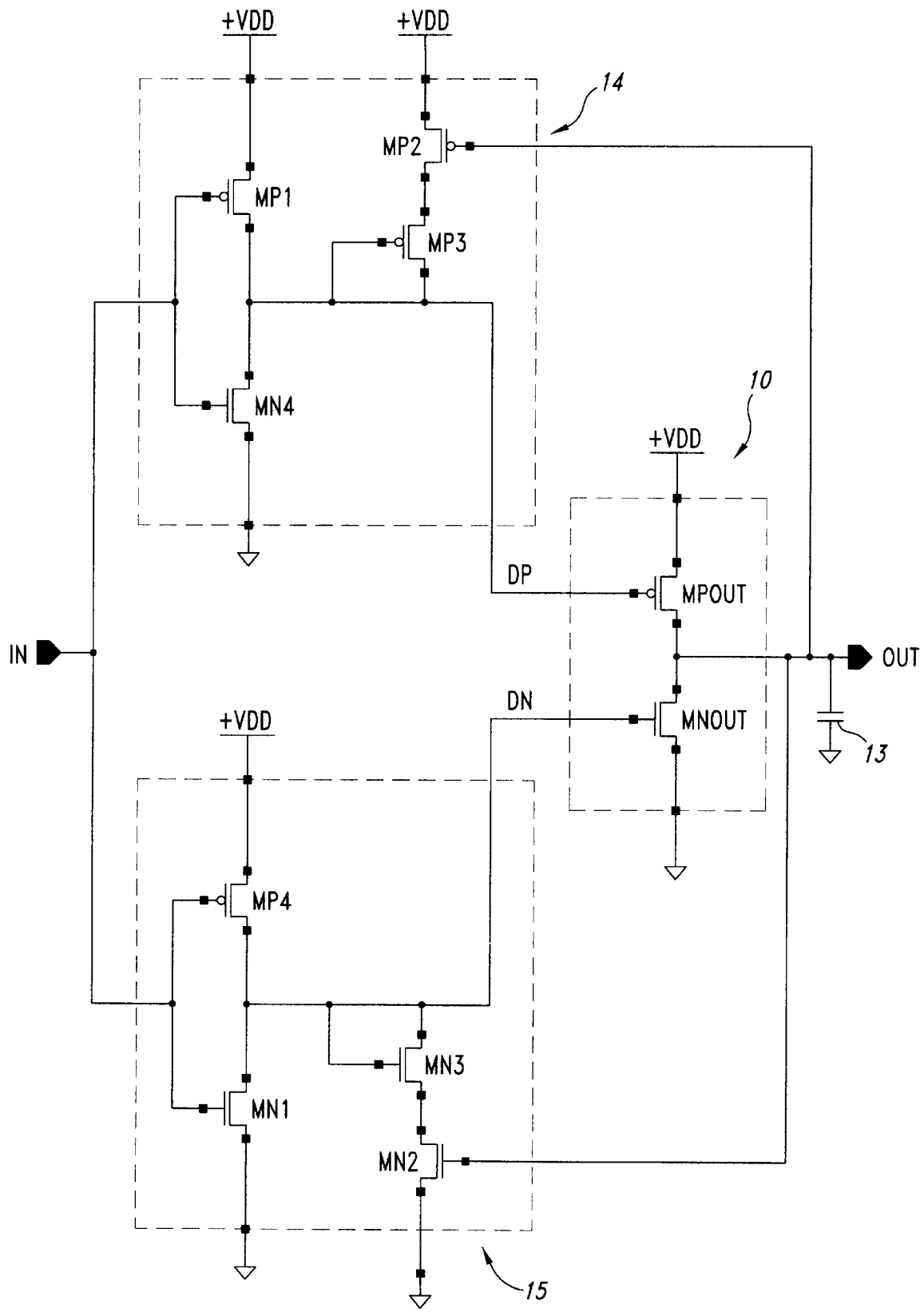
FIG. 3 shows the circuit of a buffer according to a first embodiment of the invention.

The circuit shown in FIG. 3 comprises an output stage 10 with complementary MOSFET transistors, more precisely, a p-channel transistor MPOUT and an n-channel transistor MNOUT, connected so as to operate in phase opposition between a first supply terminal +VDD and a second supply terminal, indicated by the earth symbol. The node common to the two transistors, that is, the connection node between their two drain electrodes, is the output terminal OUT of the buffer and is connected, by means of a respective pin of the integrated circuit, to an external load 13, typically a substantially capacitive load.

The circuit comprises two stages 14 and 15 for driving the transistors of the output stage 10. The driver stage 14 is constituted by two circuit branches: a first circuit branch comprises an n-channel MOS transistor MN4 and a p-channel MOS transistor MP1. The transistor MN4 which, as will be explained below, has the function of generating current, has its source electrode connected to earth, its drain electrode connected to the gate electrode of the output transistor MPOUT, and its gate electrode connected to the input terminal IN of the buffer. The transistor MP1, which has the function of a controlled electronic switch, has its gate electrode connected to the input terminal IN of the buffer. The second circuit branch of the driver stage 14 comprises a p-channel MOS transistor MP3 connected in the so-called diode arrangement, that is, with its gate and drain connected to one another, in series with a p-channel MOS transistor MP2 having the function of a controlled electronic switch. The common electrodes of the transistor MP3 are connected to the gate electrode of the output transistor MPOUT and the gate electrode of the transistor MP2 is connected to the output terminal OUT of the buffer.

The driver stage 15, as can be seen from FIG. 3, is constituted by a third branch (MP4, MN1) and by a fourth branch (MN3, MN2) having structures corresponding to those of the first and second branches of the driver stage 14.

Before the operation of the buffer of FIG. 3 is examined, it is appropriate to make some remarks relating to the nature and the dimensions of the transistors which form parts thereof. The dimensions of the output transistors MPOUT and MNOUT are determined by the same criteria as are used for the buffer of the prior art, that is, on the basis of the maximum value of the supply voltage and on the maximum value of the current to be supplied to a resistive load during direct-current operation. The transistor MP2 must operate substantially as a switch and must therefore have as low as possible an impedance when it is made conductive. The transistor MP3 must conduct a current which is a predetermined fraction of the current of the output transistor MPOUT and will therefore have dimensions correspondingly correlated with those of the transistor MPOUT (typically, it will have the same channel length and a width which is a fraction of the width of MPOUT). The transistor MN4 is intended to operate in saturation conditions, that is, with a large impedance, and must be able to supply the necessary current to MP3. The transistor MP1 is intended to operate as a switch for rapidly interrupting conduction of the output transistor MPOUT when required and is therefore dimensioned accordingly. Wholly similar remarks may be made with regard to the dimensions of the transistors of the driver stage 15 of the output transistor MNOUT.

Figure 4:
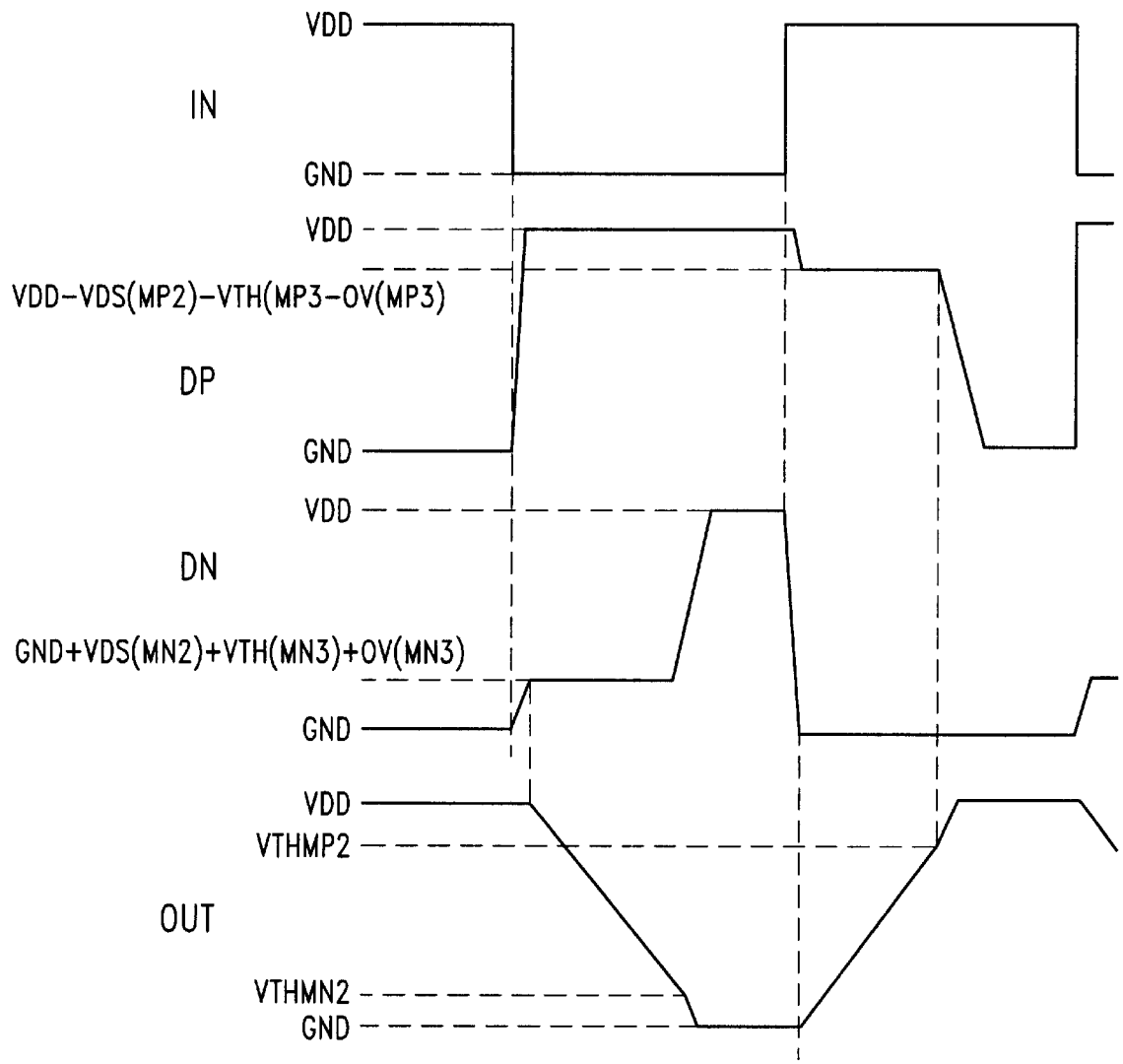
FIG. 4 shows some wave-forms which illustrate the operation of the circuit of FIG. 3.

The operation of the buffer during a switch from 0 to 1 of a digital signal applied to the input terminal IN will now be considered with reference to FIG. 4. It can easily be seen that, in the absence of a signal, with the input IN at level 0, that is, at the earth potential, the output OUT is also at 0, that is, MNOUT is conductive (on) and MPOUT is nonconductive (off). When the signal is applied to the input IN, immediately after the leading edge from 0 to 1, MP4 becomes non-conductive (off) and MN1 becomes conductive (ON). The output transistor MNOUT switches off because its gate electrode DN goes to 0. At the same time, in the driver stage 14, MP1 switches off and MN4 switches on. Since the output OUT is at 0, MP2 is on so that a current flows through MP2, MP3 and MN4, connected in series. At the gate electrode DP of the output transistor MPOUT, there will be a voltage VDD-VDS (MP2)-VTH (MP3)-VOD (MP3), that is, the supply voltage VDD, minus the voltage drop in MP2 in saturation conditions, minus the threshold voltage of MP3, minus the voltage beyond the threshold (overdrive) due to the current imposed by MN4 in MP3. By way of indication, the voltage at the node DP will be below the supply voltage VDD by a value of between 0.7 and 1.5V, according to the relative dimensions of the various transistors. In these conditions, the output transistor MPOUT, which was initially off, starts to conduct a current substantially proportional to that which passes through the transistor MP3 and to charge the capacitance of the load 13. The coefficient of proportionality is determined by the scale factor, that is, by the dimensional ratio between MPOUT and MP3. This situation is maintained throughout the time for which MP2 remains on. When the voltage at the output terminal OUT reaches a value equal to VDD minus the threshold of MP2, minus the overdrive of MP2 (very small if MP2 is of a suitable size), MP2 switches off, interrupting the flow of current through MP3 and MN4. Since MN4 is still on because the input IN is at high level (VDD), the node DP goes to 0, MPOUT is switched on and the output OUT goes to VDD. The rise in the voltage at the output OUT to VDD takes place with a constant rate of change (slew rate) for the greater portion of its swing, that is, the portion determined substantially solely by the current reflected by MP3 on MPOUT. The small residual swing is controlled by the zeroing rate of the node DP, that is, by the capacitance associated therewith (substantially the gate capacitance of MPOUT) and does not lead to a substantial increase in the current of the output transistor MPOUT which operates in the linear zone in these conditions.

When the input IN goes from 1 to 0, the output OUT switches from 1 to 0 in a manner precisely mirroring that described above.

Figure 1:
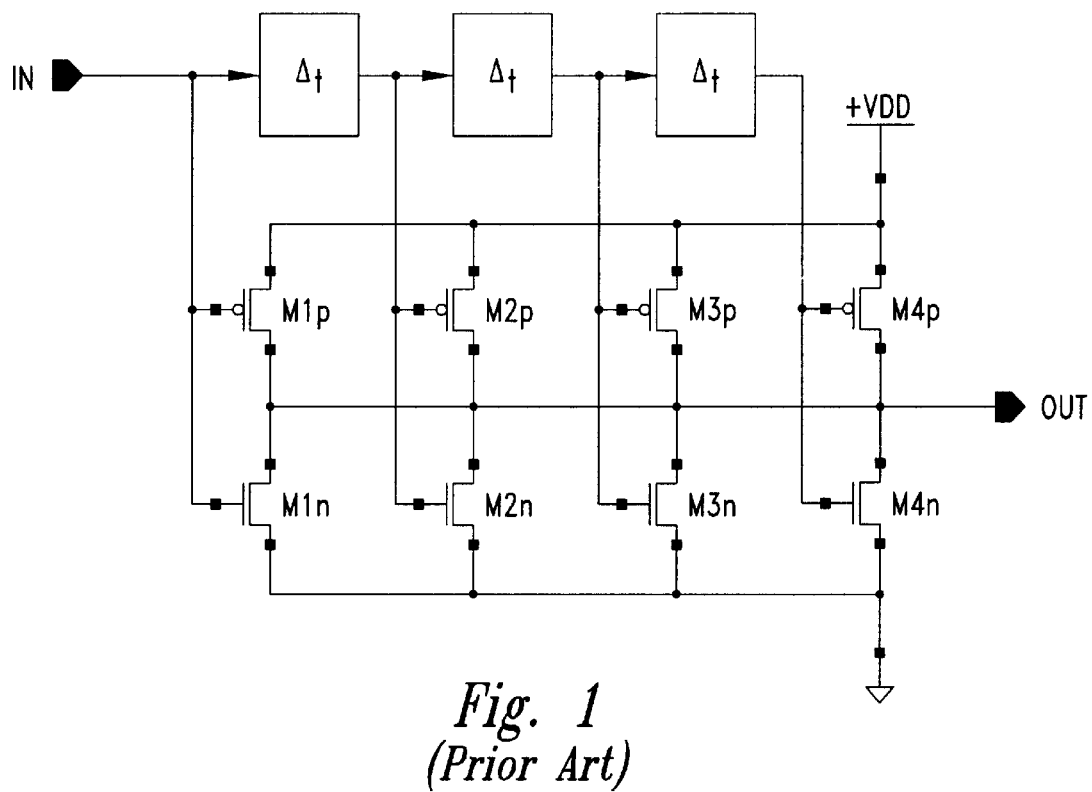
FIGS. 1 and 2 show the circuits of two known buffers.
Figure 2:
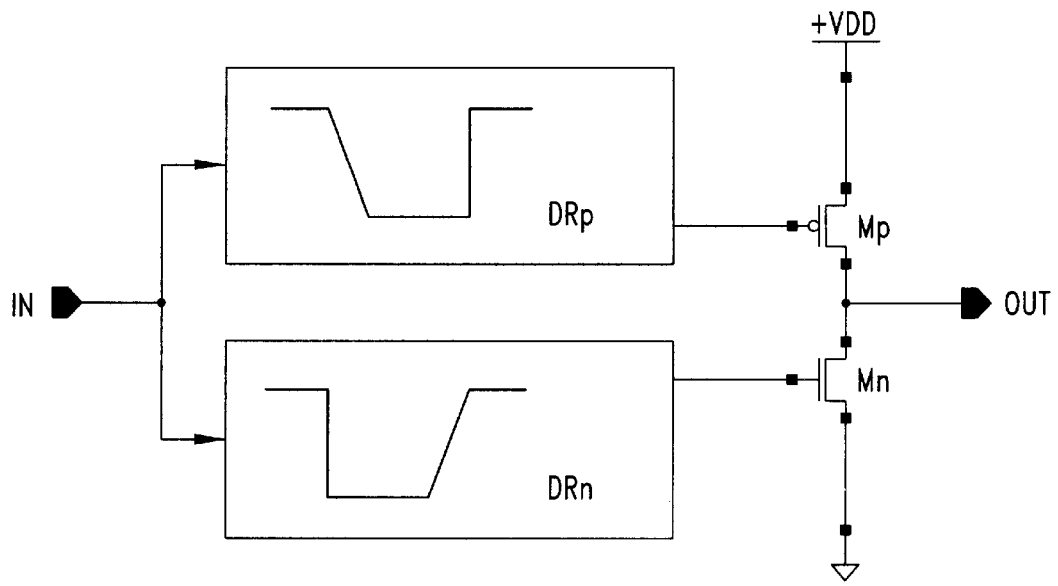

As is clear from the foregoing, in the buffer according to this depicted embodiment of the invention, the current delivered to the load 13 or absorbed thereby during the transitions of the signal is substantially independent of the load and is determined basically by the dimensions of the components of the driver stages. It should also be noted that, in contrast with the known buffer shown in FIG. 2, in which the slow voltage variation front at each of the gate electrodes of the output transistors is inactive until the threshold of the respective output transistor is exceeded, with a consequent delay of the output signal, the response of the buffer according to this depicted embodiment of the invention is very rapid since the charging of the gate capacitances of the output transistors takes place by means of the series connection of a transistor connected as a diode (MP3 or MN3) and of a transistor with the function of a switch (MP2 or MN2), both of which have low resistance. Finally, the area required to produce the buffer according to this depicted embodiment of the invention is very small, by virtue of the low number of components.

Figure 5:
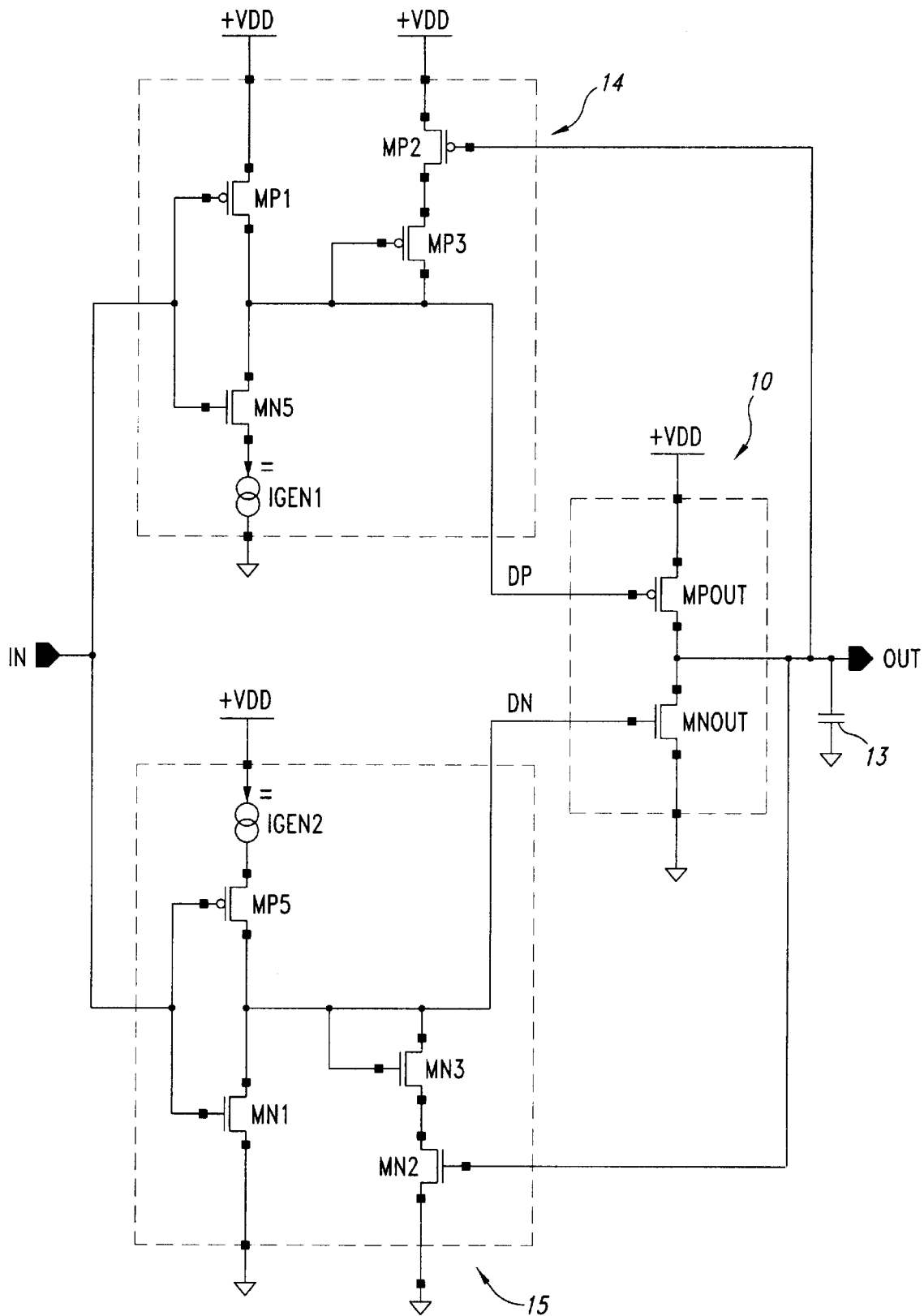
FIG. 5 shows a second embodiment of the invention.

According to the embodiment shown in FIG. 5, the transistors MN4 and MP4 of FIG. 3, which have the function of current generators, are replaced by constant-current generators IGEN1 and IGEN2 in series with respective transistors MN5 and MP5 having the function of switches controlled by the input signal. The constant-current generators IGEN1 and IGEN2 may be formed with the use of n-channel and p-channel transistors, respectively, connected as current mirrors to a biasing circuit. A biasing circuit may be provided in the integrated circuit for other purposes so that, in this case, further components are not necessary to complete the buffer, or the biasing circuit may be formed appropriately.

Figure 6:
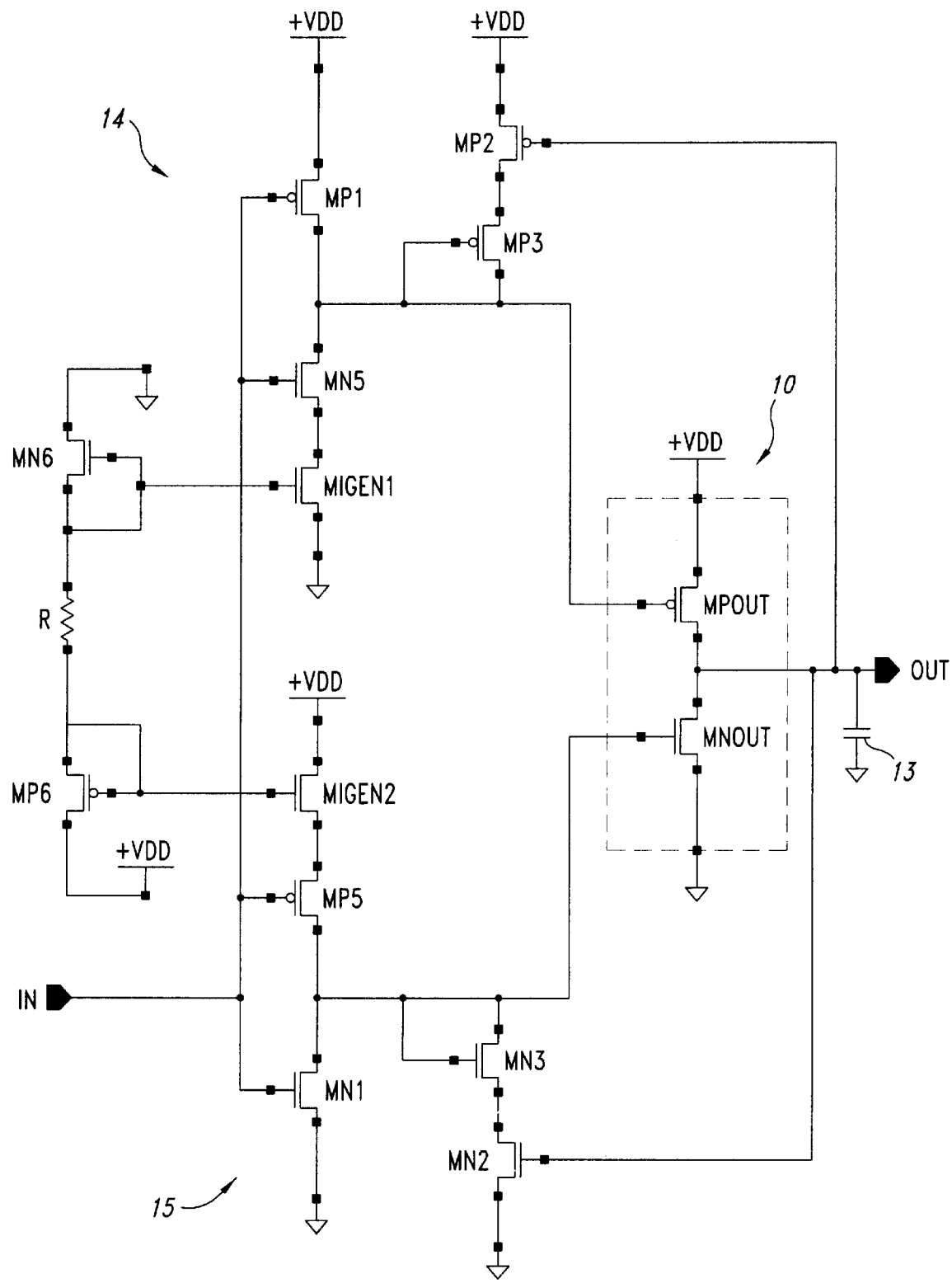
FIG. 6 shows the circuit of a possible practical implementation of the embodiment of FIG. 5.

FIG. 6 shows a possible embodiment of the biasing circuit. The transistors MIGEN1 and MIGEN2 which perform the functions of the generators IGEN1 and IGEN2 of FIG. 5 are connected as current mirrors to two transistors, MN6 and MP6, respectively, which are connected as diodes in series with a resistor R, between the supply terminals VDD and earth. The current reflected is determined substantially solely by the supply voltage and by the resistance R and, to a large extent, is insensitive to variations of the process parameters and of the operating temperature of the circuit. It should also be noted that the transistors MIGEN1 and MIGEN2 are conductive only during the transitions in the level of the input signal, by virtue of the action of the series transistors MN4 and MP5, respectively, so that their contribution to the consumption of electrical energy is very limited.

Although only two embodiments of the invention have been described and illustrated, clearly many variations and modifications are possible within the scope of the same inventive concept. For example, the buffer may be used to control an internal load of the integrated circuit which contains the buffer, rather than for controlling an external load as in the embodiments described. Accordingly, the invention is not limited except as by the appended claims.

What is claimed is:

1. An output buffer for digital signals, the output buffer comprising:
    first and second supply terminals;
    input and output terminals;
    an output stage including:
        a MOS first output transistor of a first conductivity type with a source electrode connected to the first supply terminal, a drain electrode connected to the output terminal, and a gate electrode connected to the input terminal; and
        a MOS second output transistor of a second conductivity type with a source electrode connected to the second supply terminal, a drain electrode connected to the output terminal, and a gate electrode connected to the input terminal;
    a first driver stage connecting the gate electrode of the first output transistor to the input terminal and including:
        a first circuit branch having:
            a first current-generator means connected between the gate electrode of the first output transistor and the second supply terminal, wherein the first current-generator means comprises a first current generator; and
            a first controlled electronic switch connected between the gate electrode of the first output transistor and the first supply terminal, the first controlled electronic switch having a control electrode connected to the input terminal of the buffer; and
        a second circuit branch having:
            a first MOS transistor of the first conductivity type connected as a diode in series with a second controlled electronic switch between the gate electrode of the first output transistor and the first supply terminal, the second electronic switch having a control terminal connected to the output terminal of the buffer; and
    a second driver stage connecting the gate electrode of the second output transistor to the input terminal and including:
        a third circuit branch having:
            a second current-generator means connected between the gate electrode of the second output transistor and the first supply terminal, wherein the second current-generator means comprises a second current generator; and
            a third controlled electronic switch connected between the gate electrode of the second output transistor and the second supply terminal, the third controlled electronic switch having a control electrode connected to the input terminal of the buffer; and
        a fourth circuit branch having:
            a second MOS transistor of the second conductivity type connected as a diode in series with a fourth controlled electronic switch between the gate electrode of the second output transistor and the second supply terminal, the fourth electronic switch having a control terminal connected to the output terminal of the buffer, wherein the first and second current generators are constant current generators.

2. The output buffer according to claim 1 in which the first current-generator means comprises a third MOS transistor of the second conductivity type having its gate terminal connected to the input terminal of the buffer and the second current-generator means comprises a fourth MOS transistor of the first conductivity type having its gate terminal connected to the input terminal of the buffer.

3. The output buffer according to claim 1 in which the first current generator is connected in series with a fifth controlled electronic switch having a control terminal connected to the input terminal of the buffer and the second current generator is connected in series with a sixth controlled electronic switch having a control terminal connected to the input terminal of the buffer.

4. The output buffer according to claim 1 wherein the output buffer is on an integrated circuit and a load external to the integrated circuit is connected to the output terminal.

5. The output buffer according to claim 1 wherein the output buffer is on an integrated circuit and a load on the integrated circuit is connected to the output terminal.

6. The output buffer according to claim 1 wherein the first conductivity type is P and the second conductivity type is N.

7. The output buffer according to claim 1 wherein the first supply terminal is VDD and the second supply terminal is earth.

8. An output buffer for digital signals, the output buffer comprising:
   first and second supply terminals;
   input and output terminals;
   an output stage including:
      a MOS first output transistor of a first conductivity type with a source electrode connected to the first supply terminal, a drain electrode connected to the output terminal, and a gate electrode connected to the input terminal; and
      a MOS second output transistor of a second conductivity type with a source electrode connected to the second supply terminal, a drain electrode connected to the output terminal, and a gate electrode connected to the input terminal;
   a first driver stage connecting the gate electrode of the first output transistor to the input terminal and including:
      a first circuit branch having:
         a first current-generator means connected between the gate electrode of the first output transistor and the second supply terminal, wherein the first current-generator means comprises a first current generator; and
         a first controlled electronic switch connected between the gate electrode of the first output transistor and the first supply terminal, the first controlled electronic switch having a control electrode connected to the input terminal of the buffer; and
      a second circuit branch having:
         a first MOS transistor of the first conductivity type connected as a diode in series with a second controlled electronic switch between the gate electrode of the first output transistor and the first supply terminal, the second electronic switch having a control terminal connected to the output terminal of the buffer; and
   a second driver stage connecting the gate electrode of the second output transistor to the input terminal and including:
      a third circuit branch having:
         a second current-generator means connected between the gate electrode of the second output transistor and the first supply terminal, wherein the second current-generator means comprises a second current generator; and
         a third controlled electronic switch connected between the gate electrode of the second output transistor and the second supply terminal, the third controlled electronic switch having a control electrode connected to the input terminal of the buffer; and
      a fourth circuit branch having:
         a second MOS transistor of the second conductivity type connected as a diode in series with a fourth controlled electronic switch between the gate electrode of the second output transistor and the second supply terminal, the fourth electronic switch having a control terminal connected to the output terminal of the buffer, wherein each of the first and second current generators includes a transistor connected as current mirrors to another transistor.

9. The output buffer according to claim 8 wherein the first current generator is connected in series with a fifth controlled electronic switch having a control terminal connected to the input terminal of the buffer and the second current generator is connected in series with a sixth controlled electronic switch having a control terminal connected to the input terminal of the buffer.

10. A buffer for digital signals, comprising:
   first and second supply terminals:
   input and output terminals;
   an output stage including first and second output transistors connected between the first and second supply terminals, the first and second output transistors being connected to each other at the output terminal;
   a first driver stage including:
      a first inverter connected between the input terminal and a control terminal of the first output transistor; and
      a pull-up transistor connected between the first supply terminal and the control terminal of the first output transistor, and having a control terminal connected to the output terminal; and
   a second driver stage including:
      a second inverter connected between the input terminal and a control terminal of the second output transistor; and
      a pull-down transistor connected between the second supply terminal and the control terminal of the second output transistor, and having a control terminal connected to the output terminal, wherein the first inverter includes:
         first and second inverter transistors connected to each other at an output terminal of the first inverter and having respective control terminals coupled to each other and to the input terminal; and
         a first current generator connected between the second inverter transistor and the second supply terminal.

11. The buffer of claim 10 wherein the first current generator includes:
   a first mirror transistor connected between the second inverter transistor and the second supply terminal; and
   a second mirror transistor connected between the first and second supply terminals and having a control terminal coupled to a control terminal of the first mirror transistor.

12. The buffer of claim 11 wherein the second inverter includes:
   third and fourth inverter transistors connected to each other at an output terminal of the second inverter and having respective control terminals coupled to each other and to the input terminal; and
   a second current generator connected between the third inverter transistor and the first supply terminal, wherein the second current generator includes:
      a third mirror transistor connected between the third inverter transistor and the first supply terminal; and
      a fourth mirror transistor connected between the first supply terminal and the second mirror transistor and having a control terminal coupled to a control terminal of the third mirror transistor.

13. The buffer of claim 10 wherein the first driver stage includes a diode-connected transistor connected between the pull-up transistor and the control terminal of the first output transistor.

* * * * *